United States Patent
Radosavljevic et al.

(10) Patent No.: US 11,563,098 B2
(45) Date of Patent: Jan. 24, 2023

(54) TRANSISTOR GATE SHAPE STRUCTURING APPROACHES

(71) Applicant: Intel Corporation, Santa Clara, CA (US)

(72) Inventors: Marko Radosavljevic, Portland, OR (US); Han Wui Then, Portland, OR (US); Sansaptak Dasgupta, Hillsboro, OR (US); Paul Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 885 days.

(21) Appl. No.: 16/016,391

(22) Filed: Jun. 22, 2018

(65) Prior Publication Data

US 2019/0393319 A1 Dec. 26, 2019

(51) Int. Cl.
| | |
|---|---|
| *H01L 29/423* | (2006.01) |
| *H01L 21/285* | (2006.01) |
| *H01L 29/20* | (2006.01) |
| *H01L 29/51* | (2006.01) |

(52) U.S. Cl.
CPC .. *H01L 29/42376* (2013.01); *H01L 21/28587* (2013.01); *H01L 29/2003* (2013.01); *H01L 29/518* (2013.01)

(58) Field of Classification Search
CPC ........... H01L 29/42376; H01L 29/2003; H01L 29/518; H01L 21/28587
USPC ......................................................... 257/76
See application file for complete search history.

(56) References Cited

U.S. PATENT DOCUMENTS

| | | | | |
|---|---|---|---|---|
| 5,405,787 | A * | 4/1995 | Kurimoto | H01L 21/28114 257/E21.205 |
| 9,041,061 | B2 | 5/2015 | Majumdar et al. | |
| 10,388,777 | B2 * | 8/2019 | Dasgupta | H01L 21/0262 |
| 2013/0277680 | A1 * | 10/2013 | Green | H01L 28/60 257/76 |
| 2013/0313561 | A1 | 11/2013 | Suh | |
| 2014/0091308 | A1 | 4/2014 | Dasgupta | |
| 2015/0060873 | A1 * | 3/2015 | Chiu | H01L 29/7787 257/194 |
| 2017/0125573 | A1 * | 5/2017 | Lin | H01L 29/0619 |
| 2018/0145164 | A1 * | 5/2018 | Dasgupta | H01L 21/02458 |

OTHER PUBLICATIONS

Office Action for European Patent Application No. 19175270.8, dated Dec. 5, 2019, 8 pgs.
Office Action for European Patent Application No. 19175270.8, dated Oct. 21, 2021, 7 pgs.

* cited by examiner

*Primary Examiner* — Tu-Tu V Ho
(74) *Attorney, Agent, or Firm* — Schwabe, Williamson & Wyatt, P.C.

(57) ABSTRACT

A transistor is disclosed. The transistor includes a first part of a gate above a substrate that has a first width and a second part of the gate above the first part of the gate that is centered with respect to the first part of the gate and that has a second width that is greater than the first width. The first part of the gate and the second part of the gate form a single monolithic T-gate structure.

19 Claims, 7 Drawing Sheets

TRANSISTOR GATE SHAPE STRUCTURING APPROACHES

TECHNICAL FIELD

Embodiments of the disclosure pertain to transistor gate shape and, in particular, transistor gate shape structuring.

BACKGROUND

Gallium nitride (GaN) transistors are candidates for use in future RF products such as 5G devices. Important features of transistors are gate length and gate structure. Gate length affects switching speed and gate structure (T-gate, field plate) affects gate resistance and device breakdown. T-gate transistors are a type of transistor used in RF applications. A T-gate can include a narrow gate part that is formed to contact or be in close proximity to the transistor channel and a wider gate part that is formed above the narrow gate part. The narrow gate part is designed to increase the speed of the transistor and the wider gate part is designed to lower the resistance of the gate.

In some approaches gate features such as gate length can be managed through lithography only. However, T-gate and field plate features require additional lithography and processing/metallization operations. Typically, T-gate fabrication involves lift-off techniques that are considered to be dirty by state-of-the-art CMOS fabrication standards. Recent approaches form the T-gate using a two cycle replacement-metal-gate (RMG) process. A disadvantage of such approaches is that because the T-gate is metalized in two cycles, an adhesive interface between the gate parts associated with the two cycles may be required to complete the formation of the gate. The adhesive interface between the two gate parts can increase gate resistance. Additional disadvantages of such approaches include cost (additional layers add to the cost), and manufacturability (as gate length is aggressively scaled).

DESCRIPTION OF THE EMBODIMENTS

Figure 1:
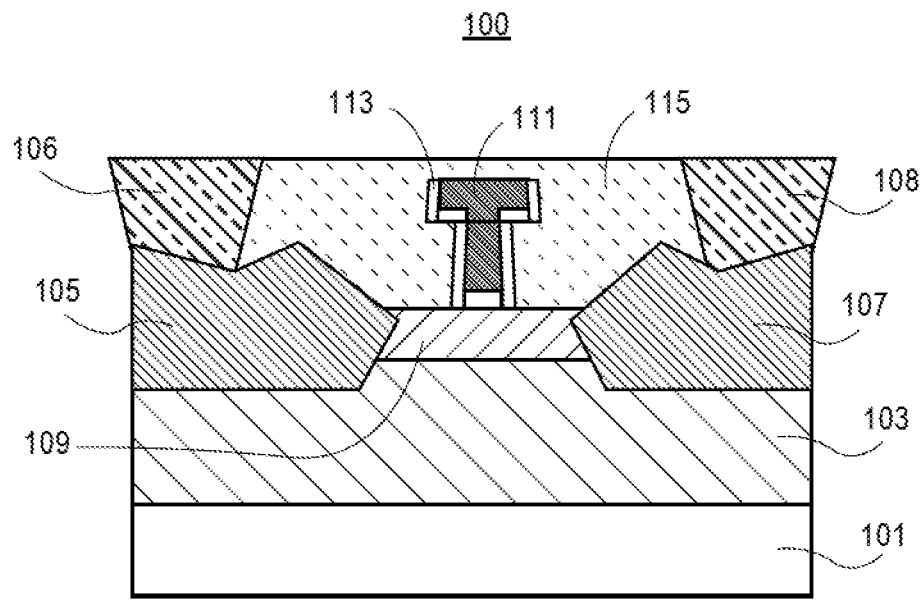
FIG. 1 is an illustration of a transistor that has a gate with a T-gate structure that is formed according to an embodiment.

Radio frequency (RF) transistor gate shape structuring approaches are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Some previous approaches to forming T-gates for transistors have proven inadequate because of drawbacks such as a replacement metal gate process that can involve a plurality of masks and/or lift-off techniques that are expensive and/or not compatible with silicon CMOS processing. Methodologies that overcome the shortcomings of such previous approaches are disclosed herein. As part of a disclosed embodiment, a T-gate is formed using bi-layered dummy gates, and based on a single patterning operation and wet etch. As part of another disclosed embodiment, a T-gate is formed using a first mask to pattern dummy material that is compatible with n+ source and drain epitaxial material and another mask that defines the final length of the gate. The embodiments that are described herein, provide low cost solutions to providing gates with low resistance and low parasitic capacitance as are needed for RF transistors for 5G and mm-wave products. In an embodiment, the T-gate is formed by means of a single metal fill operation after the cavity for the T-gate has been formed. It should be appreciated that the embodiments are compatible with state-of-the-art CMOS processing.

FIG. 1 is an illustration of a transistor 100 that has a gate with a T-gate structure that is formed according to an embodiment. FIG. 1 shows substrate 101, epitaxial layer 103, source region 105, source electrode 106, drain region 107, drain electrode 108, polarization layer 109, gate 111, high-k material 113 and insulator 115.

Referring to FIG. 1, the epitaxial layer 103 is formed on the substrate 101 which is the bottommost layer of the transistor 100. The source region 105 and the drain region 107 is formed on the epitaxial layer 103. The source electrode 106 contacts source region 105. The drain electrode 108 contacts the drain region 107. The polarization layer 109 is formed on above the epitaxial layer 103. The gate 111 is formed in a trench that is lined with the high-k material 113. The insulator 115 surrounds the high-k material 113.

In an embodiment, the substrate 101 can be formed from materials that include but are not limited to silicon. In an embodiment, the epitaxial layer 103 can be formed from GaN. In other embodiments, the epitaxial layer 103 can be formed from other materials. In an embodiment, the source region 105 and the drain region 107 can be formed from indium gallium nitride. In other embodiments, the source region 105 and the drain region 107 can be formed from other materials. In an embodiment, the source electrode 106 and the drain electrode 108 can be formed from a metal. In other embodiments, the source electrode 106 and the drain electrode 108 can be formed from other materials. In an embodiment, the polarization layer 109 can be formed from indium aluminum nitride. In other embodiments the polarization layer 109 can be formed from other materials. In an embodiment the gate 111 can be formed from tungsten. In other embodiments the gate 111 can be formed from other materials. In an embodiment, the high-k material 113 can be formed from an oxide. In other embodiments, the high-k material 113 can be formed from other materials. In an embodiment, the insulator 115 can be formed from an oxide. In other embodiments, the insulator 115 can be formed from other materials.

Referring to FIG. 1, the gate 111 has a T-shaped profile and is designed to have gate dimensions and gate resistance that establish operating parameters that maximize the performance capability of the transistor 100. The gate 111 is formed in a single cycle. In particular, both the bottom part of the gate 111 and the top part of the gate 111 are formed in a single cycle to produce the T-shaped profile. As part of the process of forming the gate 111, a space is formed that has the dimensions that have been determined to provide a gate structure with desired electrical characteristics. In an embodiment, the space is shaped by bottom and top dummy gates. After the bottom dummy gate and the top dummy gate are in place and have been encapsulated in surrounding material, the bottom dummy gate and the top dummy gate are removed from the surrounding material such that a hollow space having the desired T-shaped profile is formed. In an embodiment, conformal layers of the high-k material 113 are formed on the bottom and sidewall surfaces of the space before it is filled with the selected gate metal. The gate that is produced is a monolithic structure that has a T-shaped profile with dimensions that are determined to provide the gate 111 with gate dimensions and gate resistance that maximize performance.

In operation, transistor 100 is turned on by applying a voltage to gate 111 that causes current to conduct in the channel between the source 105 and the drain 107. In an embodiment, the gate 111 has a monolithic T-gate structure that provides reduced gate resistance to the conduction. In addition, in an embodiment, significant charge is generated at the interface of the epitaxial layer 103 and the polarization layer 109 due to the intrinsic properties of these two layers. This charge is generated without doping or the application of an electric field. As a result, based on the properties of the two materials, a channel is provided between the source 105 and the drain 107 that has low resistance. The lower gate resistance and channel resistance of transistor 100 impact parameters that are important to its RF performance such as input impedance, speed and noise.

Figure 2:
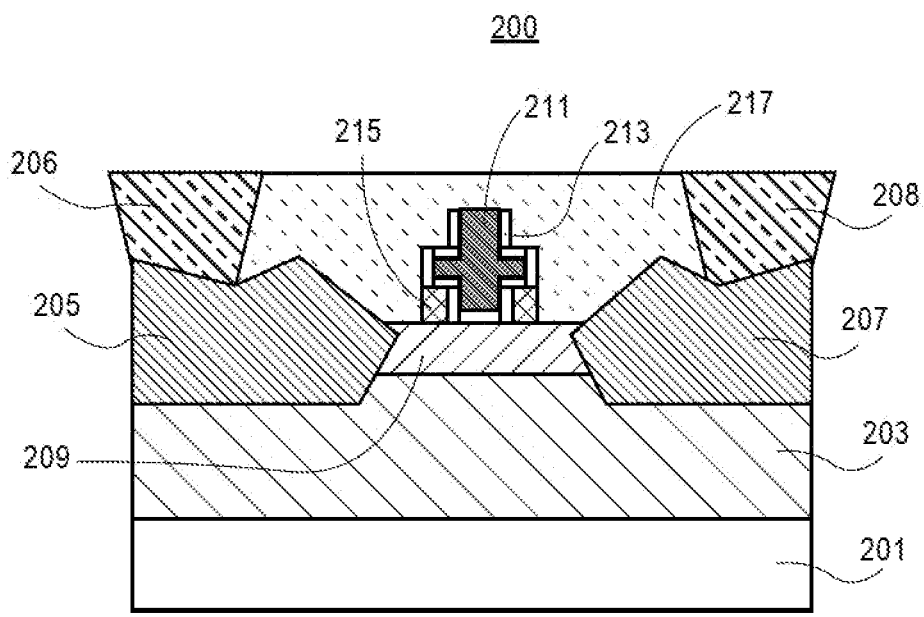
FIG. 2 is an illustration of a transistor that has a gate with a T-gate structure that is formed according to an embodiment.

FIG. 2 is an illustration of a transistor 200 that has a gate with a T-gate structure that is formed according to an embodiment. FIG. 2 shows substrate 201, epitaxial layer 203, source region 205, source electrode 206, drain region 207, drain electrode 208, polarization layer 209, gate 211, high-k material 213, insulator 215 and insulator 217.

Referring to FIG. 2, the epitaxial layer 203 is formed on substrate 201 which is the bottommost layer of the transistor 200. The source region 205 and the drain region 207 is formed on the epitaxial layer 203. The polarization layer 209 is formed on the epitaxial layer 203. The gate 211 is formed in a trench that is lined with the high-k material 213. The bottom part of the gate 211 is bracketed by the insulator 215. The source electrode 206 is formed above the source region 205. The drain electrode 208 is formed above the drain region 207.

In an embodiment, the substrate 201 can be formed from silicon. In other embodiments, the substrate 201 can be formed from other materials. In an embodiment, the epitaxial layer 203 can be formed from GaN. In other embodiments, the epitaxial layer 203 can be formed from other materials. In an embodiment, the source region 205 and the drain region 207 can be formed from indium gallium nitride. In other embodiments the source region 205 and the drain region 207 can be formed from other materials. In an embodiment, the source electrode 206 and the drain electrode 208 can be formed from metal. In other embodiments, the source electrode 206 and the drain electrode 208 can be formed from other materials. In an embodiment, the polarization layer 209 can be formed from indium aluminum nitride. In other embodiments the polarization layer 209 can be formed from other materials. In an embodiment the gate 211 can be formed from tungsten. In other embodiments, the gate 211 can be formed from other materials. In an embodiment, the high-k material 213 can be formed from an oxide. In other embodiments, the high-k material 213 can be formed from other materials. In an embodiment, the insulator 215 can be formed from a nitride. In other embodiments, the insulator 215 can be formed from other materials. In an embodiment, the insulator 217 can be formed from an oxide. In other embodiments, the insulator 217 can be formed from other materials.

Referring to FIG. 2, the gate 211, similar to the gate 111 in FIG. 1, has a T-shaped profile that is designed to provide gate dimensions and gate resistance that establish operating parameters that enhance the performance capability of the transistor 200. During the structuring of the space for the gate, the width of the opening corresponding to the top part of gate 211 controls the width of an etch into the insulator 215 that forms a space for the bottom part of the gate 211 that contacts the polarization layer 209. Similar to the embodiment, of FIG. 1, the gate 211 is formed in a single cycle. In particular, each of the bottom part of the gate 211, the intermediate part of the gate 211 and the top part of the gate 211 are formed with a single metal fill operation to produce the T-shaped profile. As part of the process of forming the gate 211, the space that is created for the purpose of shaping the gate is formed to have dimensions that have been determined to provide a gate structure with desired electrical characteristics. In an embodiment, a first two portions of the space is shaped by a bottom dummy gate and an intermediate dummy gate. After the bottom dummy gate and the intermediate dummy gate are in place, a top dummy gate is formed above the intermediate dummy gate. Subsequently, the top dummy gate and the intermediate dummy gate are removed such that a window is formed having a width that is equal in size to the width that is desired for the bottom portion of the gate. Thereafter, a space is etched into insulator 215 through the window to complete the shaping of the space for the gate 211. Based on these operations a space having the desired T-shaped profile is created. In an embodiment, a conformal layer of the high-k material 213 is formed on the bottom and sidewall surfaces of the space before it is filled with the gate metal. Thus, a gate with a monolithic T-shaped profile is produced that has been determined to provide the gate with dimensions and resistance that maximize performance.

In an embodiment, gate length scaling is facilitated by the etch through the insulator 215. As described above, the etch will affect an area of short length that corresponds to the etch window created by the dummy gate layers.

In operation, transistor 200 is turned on by applying a voltage to gate 211 that causes current to conduct in the channel between the source and the drain. In an embodiment, the gate 211 has a monolithic T-gate structure that provides reduced gate resistance. In addition, in an embodiment, significant charge is generated at the interface of the epitaxial layer 203 and the polarization layer 209 due to the intrinsic properties of the two materials. This charge is generated without doping or the application of an electric field. As a result, based on the properties of the two materials, a channel is provided between the source region 205 and the drain region 207 that has a low resistance. The low gate resistance and channel resistance of transistor 200 impact parameters that are important to its RF performance such as input impedance, speed and noise.

FIG. 3A-FIG. 3E are illustrations of cross-sections of a semiconductor structure in a process of fabricating a transistor with a T-gate.

Figure 3A:
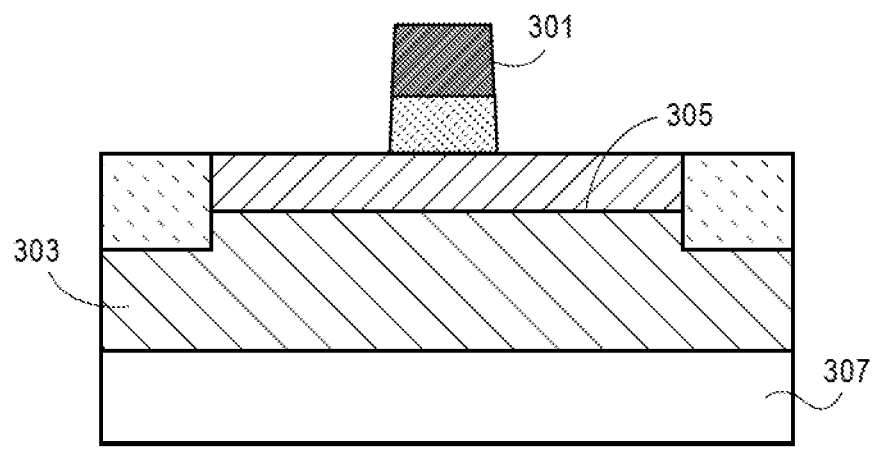
FIGS. 3A-3E are illustrations of cross-sections of a semiconductor structure in a process of fabricating a transistor gate.

Referring to FIG. 3A, after a plurality of operations, the cross-section of semiconductor structure 300 is produced that includes dummy gate structure 301, epitaxial layer 303, polarization layer 305 and substrate 307. The dummy gate structure 301 includes top and bottom parts.

Figure 3B:
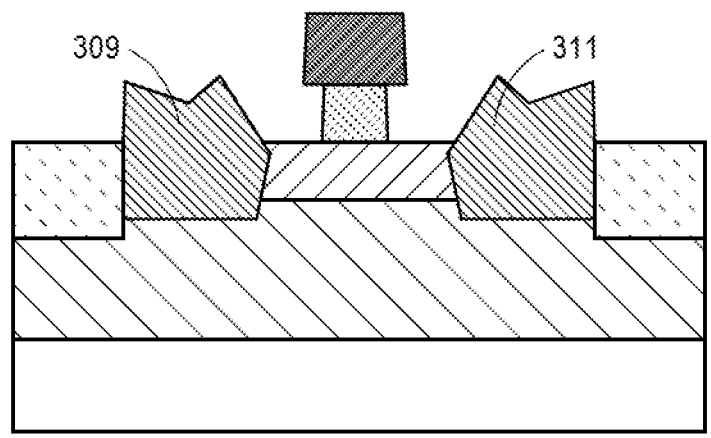

Referring to FIG. 3B, after one or more operations that result in the cross-section in FIG. 3A, an epitaxial undercut is performed that forms spaces for source 309 and drain 311 material. Thereafter, source 309 and drain 311 material is formed in the spaces that are formed by the epitaxial undercut.

Figure 3C:
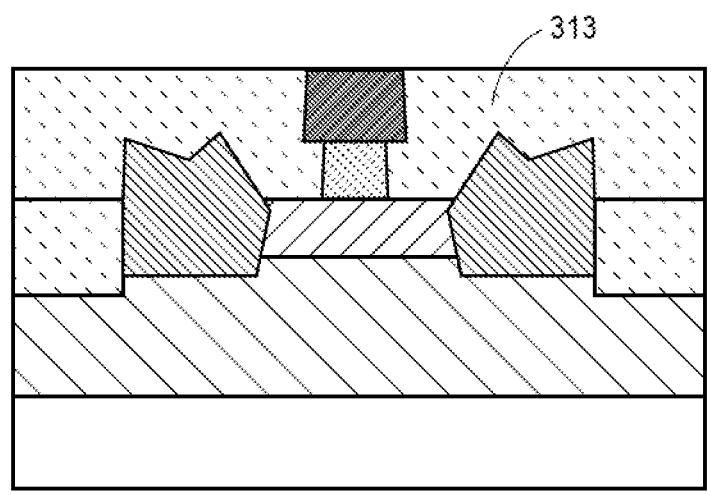

Referring to FIG. 3C, after one or more operations that result in the cross-section shown in FIG. 3B, a bottom dummy gate undercut is performed. The top of the semiconductor structure is covered with a blanket layer of insulator material 313 that fills the space that is formed from the bottom dummy gate undercut. The insulator material 313 is then planarized. In an embodiment, the planarization can be done by polishing. In other embodiments, the planarization can be done by other suitable methods.

Figure 3D:
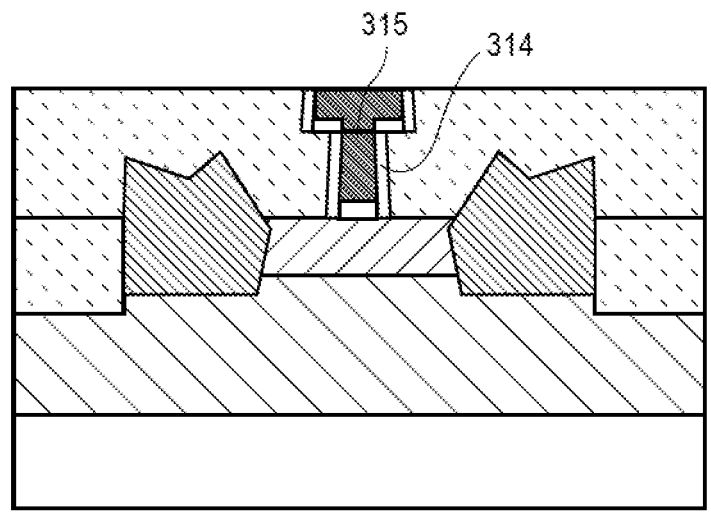

Referring to FIG. 3D, after one or more operations that result in the cross-section shown in FIG. 3C, both dummy gate parts are removed. Thereafter, the space is lined with a high-k material 314 and filled with gate conductor material 315. In an embodiment, the gate conductor material 315 can be formed with a metal. In other embodiments, the gate conductor can be formed from other materials.

Figure 3E:
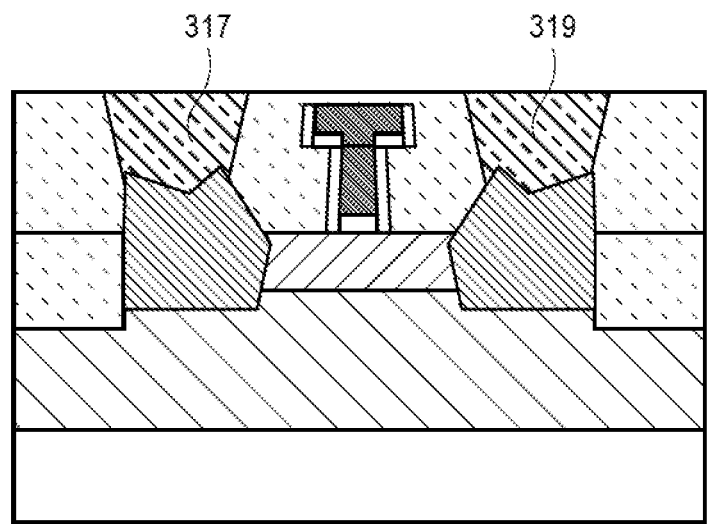

Referring to FIG. 3E, after one or more operations that result in the cross-section shown in FIG. 3D, the semiconductor structure 300 is patterned to form source electrode 317 and drain electrode 319. In an embodiment, the source and drain electrodes trenches are formed to form source and drain electrodes.

FIG. 4A-FIG. 4F are illustrations of cross-sections of a semiconductor structure in a process of fabricating a transistor gate.

Figure 4A:
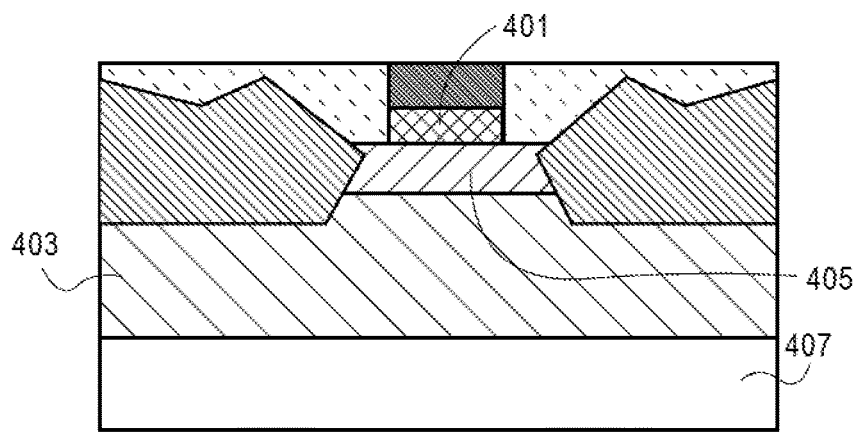
FIGS. 4A-4F are illustrations of cross-sections of a semiconductor structure in a process of fabricating a transistor gate.

Referring to FIG. 4A, after a plurality of operations, the cross-section of semiconductor structure 400 is produced that includes dummy gate structure 401, epitaxial layer 403, polarization layer 405 and substrate 407. The dummy gate structure 401 includes an upper polysilicon part and a lower insulator part.

Figure 4B:
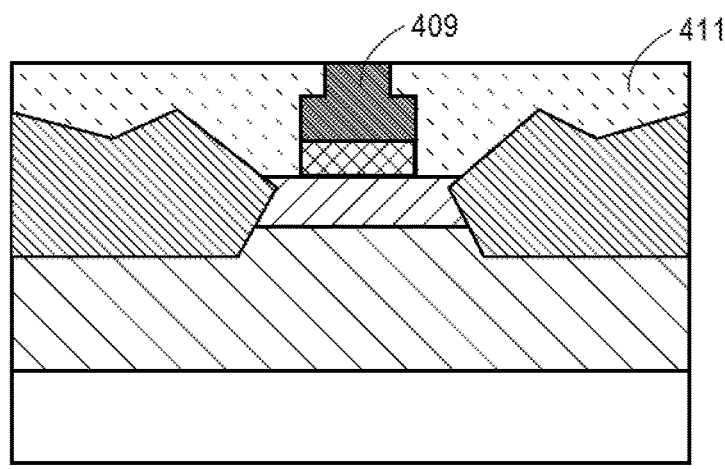

Referring to FIG. 4B, after one or more operations that result in the cross-section in FIG. 4A, a polysilicon layer is formed on the surface of the semiconductor structure 400. Thereafter, the polysilicon layer is patterned to form a top dummy gate part 409. Then, a fill is performed that covers the semiconductor structure with insulator material 411 which is subsequently planarized.

Figure 4C:
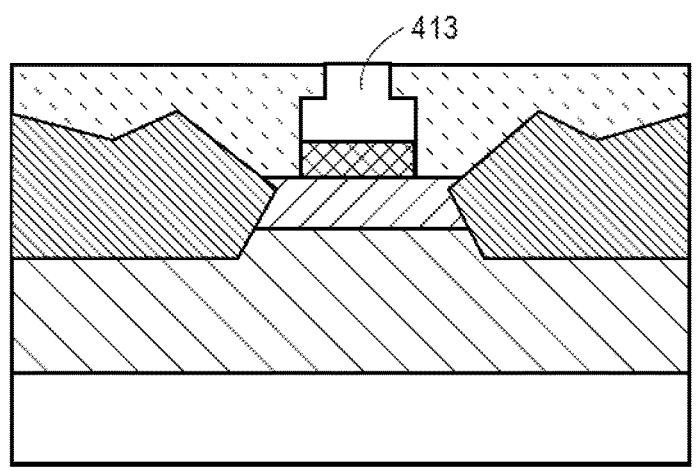

Referring to FIG. 4C, after one or more operations that result in the cross-section shown in FIG. 4B, the top dummy gate part and the dummy gate part underneath the top dummy gate part is removed. In an embodiment, the space 413 that is created from the removal of these dummy gate parts creates an etch window having a width that is defined by the width of the removed top dummy gate part.

Figure 4D:
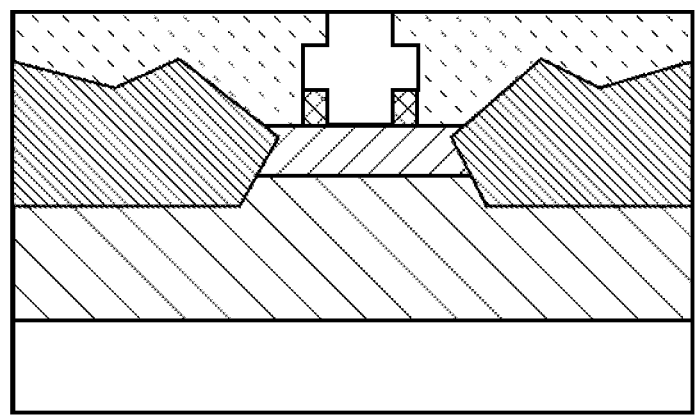

Referring to FIG. 4D, after one or more operations that result in the cross-section shown in FIG. 4C, the lower dummy gate part is etched such that a space in the lower dummy gate part is created that is equal in width to the width of the etch window. The space that is created from the etch provides the desired gate shape.

Figure 4E:
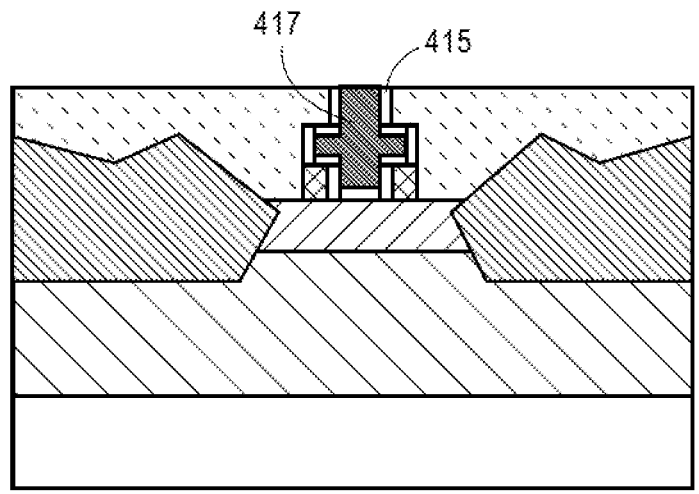

Referring to FIG. 4E, after one or more operations that result in the cross-section shown in FIG. 4D, the space created for the gate is lined with a high-k material 415 and thereafter filled with gate conductor material 417. In an embodiment, the gate conductor material 417 can include a metal such as tungsten. In other embodiments, the gate conductor material 417 can included other materials.

Figure 4F:
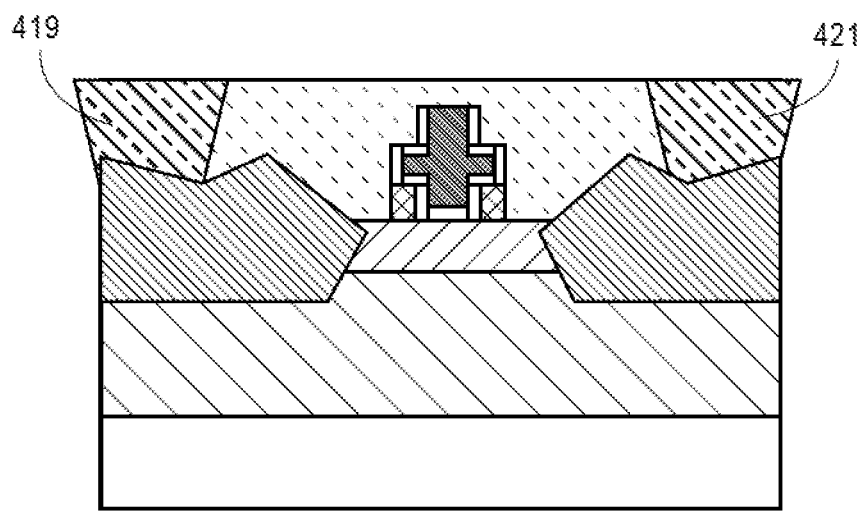

Referring to FIG. 4F, after one or more operations that result in the cross-section shown in FIG. 4E, the semiconductor structure 400 is patterned and source and drain electrode trenches are formed. In an embodiment, the source electrode 419 and the drain electrode 421 are thereafter formed in the trenches.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
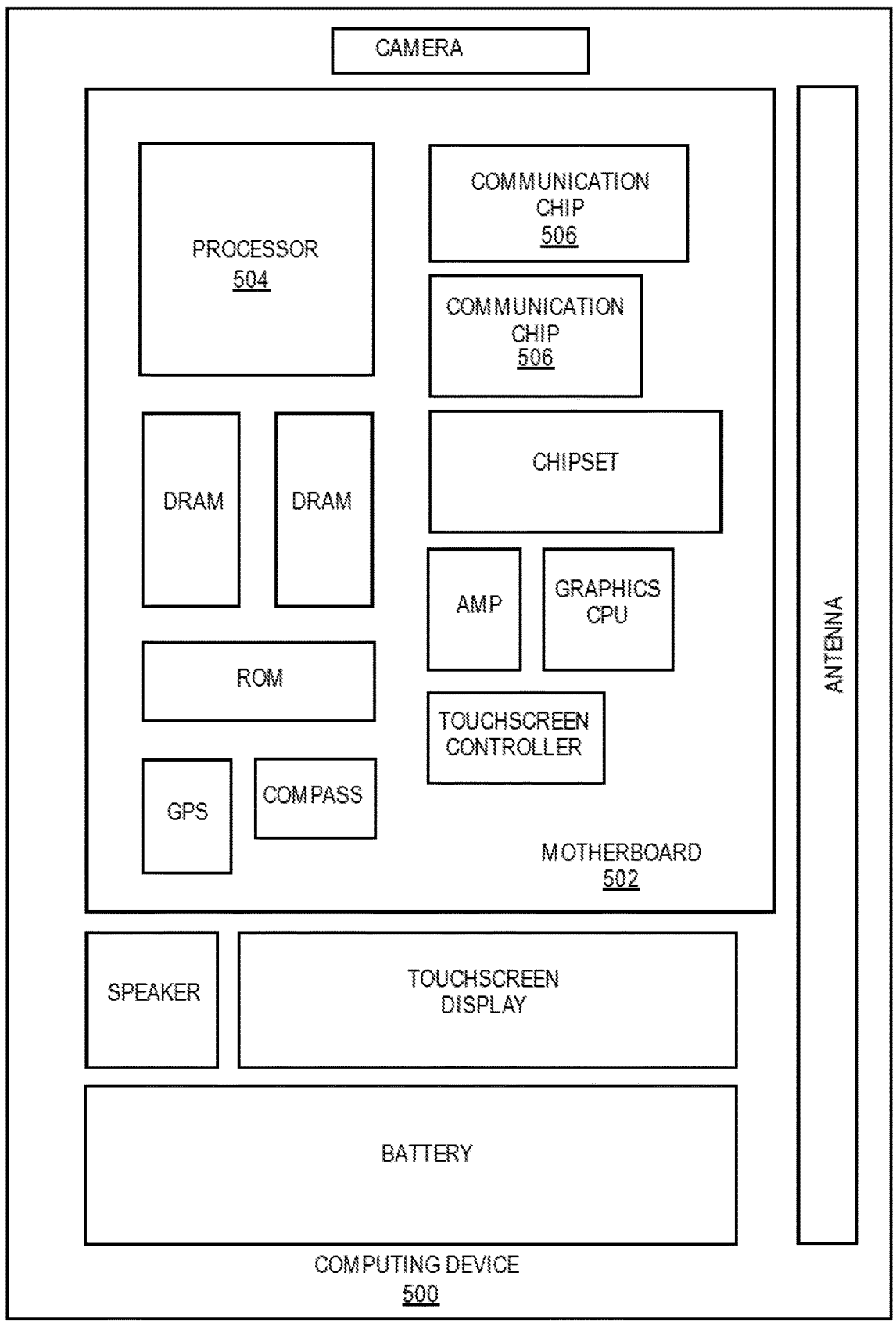
FIG. 5 illustrates a computing device in accordance with one implementation.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
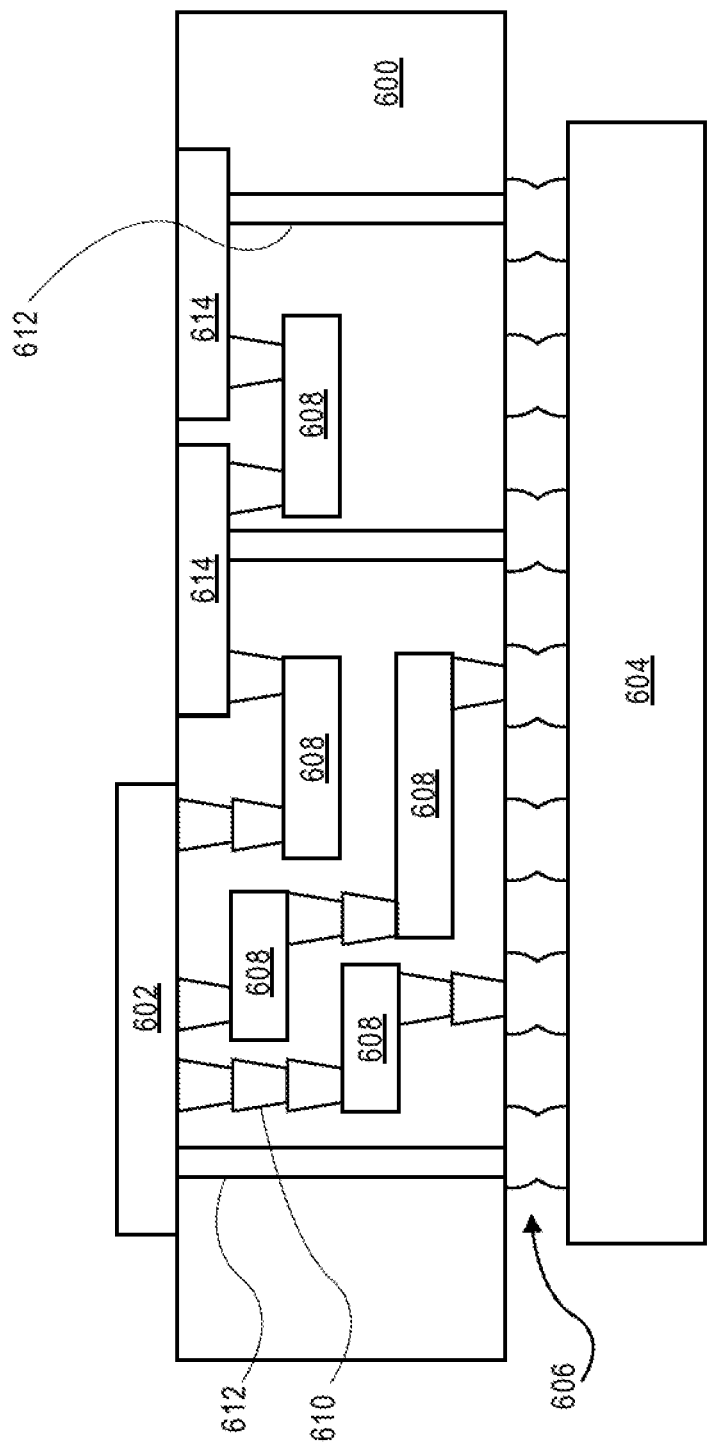
FIG. 6 illustrates an interposer that includes one or more embodiments.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A transistor including a first part of a gate above a substrate that has a first width and a second part of the gate above the first part of the gate that is centered with respect to the first part of the gate and that has a second width that is greater than the first width. The first part of the gate and the second part of the gate form a single monolithic T-gate structure.

Example embodiment 2: The transistor of example embodiment 1, further comprising a gallium nitride epitaxial layer.

Example embodiment 3: The transistor of example embodiment 1, further comprising a polarization layer.

Example embodiment 4: The transistor of example embodiment 1, 2 or 3 wherein the T-gate structure is surrounded by high-k material.

Example embodiment 5: The transistor of example embodiment 2, wherein the first part of the gate is above the gallium nitride epitaxial layer.

Example embodiment 6: The transistor of example embodiment 3, wherein the first part of the gate extends to top surface of the polarization layer.

Example embodiment 7: The transistor of example embodiment 4, wherein an insulator surrounds the top and the sides of the T-gate structure and the high-k material.

Example embodiment 8: A transistor including a first part of a gate above a substrate that has a first width and a second part of the gate above the first part of the gate that has a second width that is greater than the first width. A third part of the gate is above the second part of the gate and has a third width that is less than the second width and the same as the first width.

Example embodiment 9: The transistor of example embodiment 8, wherein the third part of the gate is centered with respect to the second part.

Example embodiment 10: The transistor of example embodiment 8, wherein the second part of the gate includes first and second regions that extend above isolation nitride.

Example embodiment 11: The transistor of example embodiment 8, wherein the first part of the gate is bracketed by isolation nitride.

Example embodiment 12: The transistor of example embodiment 8, wherein the first part of the gate is formed above a gallium nitride epitaxial layer.

Example embodiment 13: The transistor of example embodiment 8, wherein the first part of the gate is formed above a polarization layer.

Example embodiment 14: The transistor of example embodiments 8, 9, 10, 11, 12 or 13 wherein the gate is surrounded by a gate insulator material.

Example embodiment 15: A method including forming a first part of a gate above a substrate that has a first width and forming a second part of the gate above the first part of the gate that is centered with respect to the first part of the gate and that has a second width that is greater than the first width. The first part of the gate and the second part of the gate form a single monolithic T-gate structure.

Example embodiment 16: The method of example embodiment 15, further comprising a gallium nitride epitaxial layer above the substrate.

Example embodiment 17: The method of example embodiment 16, further comprising a polarization layer above the gallium nitride epitaxial layer.

Example embodiment 18: The method of example embodiment 15, wherein the T-gate structure is surrounded by high-k material.

Example embodiment 19: The method of example embodiment 16, wherein the first part of the gate is above the gallium nitride epitaxial layer.

Example embodiment 20: The method of example embodiments 17, 18, or 19 wherein the first part of the gate extends to a top surface of the polarization layer.

What is claimed is:

1. A transistor, comprising:
   a first part of a gate above a substrate that has a first width;
   a second part of the gate above the first part of the gate that is centered with respect to the first part of the gate and that has a second width that is greater than the first width, wherein the first part of the gate and the second part of the gate form a single monolithic T-gate structure;
   a high-k material beneath and laterally surrounding the T-gate structure;
   a dielectric layer laterally surrounding both the first part of the gate and the second part of the gate, the dielectric layer having a bottommost surface below a bottommost surface of the first part of the gate;
   a first source or drain structure adjacent to a first side of the T-gate structure, the first source or drain structure having a bottommost surface below a bottommost surface of the high-k material; and
   a second source or drain structure adjacent to a second side of the T-gate structure, the second side opposite the first side, the first source or drain structure having a bottommost surface below the bottommost surface of the high-k material.

2. The transistor of claim 1, further comprising a gallium nitride epitaxial layer.

3. The transistor of claim 2, wherein the first part of the gate is above the gallium nitride epitaxial layer.

4. The transistor of claim 1, further comprising a polarization layer.

5. The transistor of claim 4, wherein the first part of the gate extends to top surface of the polarization layer.

6. The transistor of claim 1, wherein the dielectric layer surrounds the top and the sides of the T-gate structure and the high-k material.

7. A method, comprising:
   forming a first part of a gate above a substrate that has a first width;
   forming a second part of the gate above the first part of the gate that is centered with respect to the first part of the gate and that has a second width that is greater than the first width, wherein the first part of the gate and the second part of the gate form a single monolithic T-gate structure;
   forming a high-k material beneath and laterally surrounding the T-gate structure;
   forming a dielectric layer, the dielectric layer laterally surrounding both the first part of the gate and the second part of the gate, and the dielectric layer having a bottommost surface below a bottommost surface of the first part of the gate;
   forming a first source or drain structure adjacent to a first side of the T-gate structure, the first source or drain structure having a bottommost surface below a bottommost surface of the high-k material; and
   forming a second source or drain structure adjacent to a second side of the T-gate structure, the second side opposite the first side, the first source or drain structure having a bottommost surface below the bottommost surface of the high-k material.

8. The method of claim 7, further comprising a gallium nitride epitaxial layer above the substrate.

9. The method of claim 8, further comprising a polarization layer above the gallium nitride epitaxial layer.

10. The method of claim 9, wherein the first part of the gate extends to a top surface of the polarization layer.

11. The method of claim 8, wherein the first part of the gate is above the gallium nitride epitaxial layer.

12. A transistor, comprising:
    a first part of a gate above a substrate that has a first width;
    a second part of the gate above the first part of the gate that has a second width that is greater than the first width; and
    a third part of the gate above the second part of the gate that has a third width that is less than the second width and the same as the first width, wherein the gate is surrounded by a gate insulator material.

13. The transistor of claim 12, wherein the third part of the gate is centered with respect to the second part.

14. The transistor of claim 12, wherein the second part of the gate includes first and second regions that extend above isolation nitride.

15. The transistor of claim 12, wherein the first part of the gate is bracketed by isolation nitride.

16. The transistor of claim 12, wherein the first part of the gate is formed above a gallium nitride epitaxial layer.

17. The transistor of claim 12, wherein the first part of the gate is formed above a polarization layer.

18. A transistor, comprising:
    a first part of a gate above a substrate that has a first width, wherein the first part of the gate is formed above a gallium nitride epitaxial layer;
    a second part of the gate above the first part of the gate that has a second width that is greater than the first width; and a third part of the gate above the second part of the gate that has a third width that is less than the second width and the same as the first width.

19. A transistor, comprising:

a first part of a gate above a substrate that has a first width, wherein the first part of the gate is formed above a polarization layer;

a second part of the gate above the first part of the gate that has a second width that is greater than the first width; and a third part of the gate above the second part of the gate that has a third width that is less than the second width and the same as the first width.

\* \* \* \* \*